(12) United States Patent
Hewett et al.

(10) Patent No.: US 6,969,672 B1
(45) Date of Patent: Nov. 29, 2005

(54) METHOD AND APPARATUS FOR CONTROLLING A THICKNESS OF A CONDUCTIVE LAYER IN A SEMICONDUCTOR MANUFACTURING OPERATION

(75) Inventors: Joyce S. Obey Hewett, Austin, TX (US); Alexander James Pasadyn, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 392 days.

(21) Appl. No.: 09/909,074

(22) Filed: Jul. 19, 2001

(51) Int. Cl.$^7$ .............................................. H01L 21/20
(52) U.S. Cl. ...................... 438/584; 438/597; 205/80; 205/81; 205/82; 205/83; 205/84; 427/523; 427/531
(58) Field of Search ................................ 438/687, 584, 438/597; 700/159; 205/80, 81, 82, 83, 84, 205/96; 427/523, 531

(56) References Cited

U.S. PATENT DOCUMENTS

| | | | | |
|---|---|---|---|---|
| 3,819,502 | A * | 6/1974 | Meuldijk et al. ............ | 204/206 |
| 5,330,850 | A * | 7/1994 | Suzuki et al. ............... | 425/623 |
| 5,485,663 | A * | 1/1996 | Ochiai et al. ............... | 29/25.35 |
| 6,077,413 | A * | 6/2000 | Hafeli et al. ................ | 205/170 |
| 6,322,713 | B1 * | 11/2001 | Choi et al. .................. | 216/38 |
| 6,436,265 | B1 * | 8/2002 | Shimada et al. | |
| 6,440,295 | B1 * | 8/2002 | Wang .......................... | 205/640 |
| 6,503,376 | B2 * | 1/2003 | Toyoda et al. .............. | 204/252 |
| 6,537,683 | B1 * | 3/2003 | Staschko et al. ............ | 428/610 |
| 6,685,814 | B2 * | 2/2004 | Uzoh et al. .................. | 205/96 |
| 2002/0032499 | A1 * | 3/2002 | Wilson et al. | |
| 2003/0064165 | A1 * | 4/2003 | Seo et al. ................ | 427/430.1 |
| 2004/0256245 | A1 * | 12/2004 | Wang ........................ | 205/658 |

* cited by examiner

*Primary Examiner*—W. David Coleman
*Assistant Examiner*—Khiem D. Nguyen
(74) *Attorney, Agent, or Firm*—Williams, Morgan & Amerson

(57) ABSTRACT

A method of controlling a conductive layer deposition process includes depositing a conductive layer onto a semiconductor wafer based upon a deposition recipe, measuring a thickness of the conductive layer deposited on the semiconductor wafer, determining whether the measured thickness of the conductive layer is within a predetermined tolerance, and revising the deposition recipe if the thickness of the conductive layer is not within the predetermined tolerance. An apparatus includes a deposition unit capable of depositing a conductive layer according to a deposition recipe; a thickness measuring unit capable of measuring at least one thickness of the conductive layer and outputting thickness data; and a deposition control unit capable of receiving the thickness data from the thickness measuring unit, determining whether the thickness data is within a predetermined tolerance, revising the deposition recipe if the thickness data is not within the predetermined tolerance, and outputting the revised deposition recipe.

13 Claims, 5 Drawing Sheets

METHOD AND APPARATUS FOR CONTROLLING A THICKNESS OF A CONDUCTIVE LAYER IN A SEMICONDUCTOR MANUFACTURING OPERATION

BACKGROUND OF THE INVENTION

1. Field of the Invention

This invention relates to semiconductor manufacturing and, in one aspect, to a method and apparatus for controlling a thickness of a deposited layer in a semiconductor manufacturing operation.

2. Description of the Related Art

There is a constant drive within the semiconductor industry to increase the quality, reliability and throughput of integrated circuit devices, e.g., microprocessors, memory devices, and the like. This drive is fueled by consumer demands for higher-quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. For example, in conventional semiconductor wafer manufacturing operations, thicknesses of deposited conductive layers (e.g., copper leads, lines, interconnects, contacts, vias, plugs, and the like) either go unmonitored or are checked on a lot-by-lot basis. In general, such conductive layers undergo a subsequent chemical mechanical planarization (CMP) step, wherein the exposed surface of the conductive layer is planarized and the thickness of the conductive layer is brought into tolerance. If the thickness of a conductive layer is below the tolerance range, there may be insufficient material within the conductive layer for the conductive layer to properly conduct electrons. If the thickness of the conductive layer is above the tolerance range, additional time and materials may be required in the CMP step to remove the excess material. If thickness of conductive layers are checked on a lot-by-lot basis by measuring one or more wafers within the lot, whether they be production wafers or expendable qualification wafers, adjustments to the deposition process can generally be made no more frequently than between lots.

The present invention is directed to overcoming, or at least reducing the effects of, one or more of the problems set forth above.

SUMMARY OF THE INVENTION

In one aspect of the present invention, a method is provided that is capable of controlling a conductive layer deposition process. The method includes depositing a conductive layer onto a first semiconductor wafer based upon a deposition recipe, measuring a thickness of the conductive layer deposited on the semiconductor wafer, determining whether the measured thickness of the conductive layer is within a predetermined tolerance, and revising the deposition recipe if the thickness of the conductive layer is not within the predetermined tolerance.

In another aspect of the present invention, a method is provided that is capable of controlling a conductive layer deposition process. The method includes depositing a conductive layer onto a first semiconductor wafer based upon a deposition recipe, measuring a thickness of the conductive layer at a plurality of locations on the semiconductor wafer, calculating a value representing the measured thickness measured at the plurality of locations, determining whether the calculated value is within a predetermined tolerance, and revising the deposition recipe if the calculated value is not within the predetermined tolerance.

In yet another aspect of the present invention, an apparatus is provided including a deposition unit capable of depositing a conductive layer onto a semiconductor wafer according to a deposition recipe; a thickness measuring unit capable of measuring at least one thickness of the conductive layer and outputting thickness data; and a deposition control unit capable of receiving the thickness data from the thickness measuring unit, determining whether the thickness data is within a predetermined tolerance, revising the deposition recipe if the thickness data is not within the predetermined tolerance, and outputting the revised deposition recipe. The deposition unit is capable of receiving the revised deposition recipe from the deposition control unit.

In a further aspect of the present invention, an apparatus is provided including a deposition tool capable of depositing a conductive layer onto a semiconductor wafer; a deposition tool controller capable of controlling the deposition tool according to a deposition recipe; a measurement tool capable of measuring at least one thickness of the conductive layer; a measurement tool controller capable of controlling the measurement tool and outputting thickness data; and a computer capable of receiving the thickness data from the measurement tool controller, determining whether the thickness data is within a predetermined tolerance, and outputting a revised deposition recipe to the deposition tool controller.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
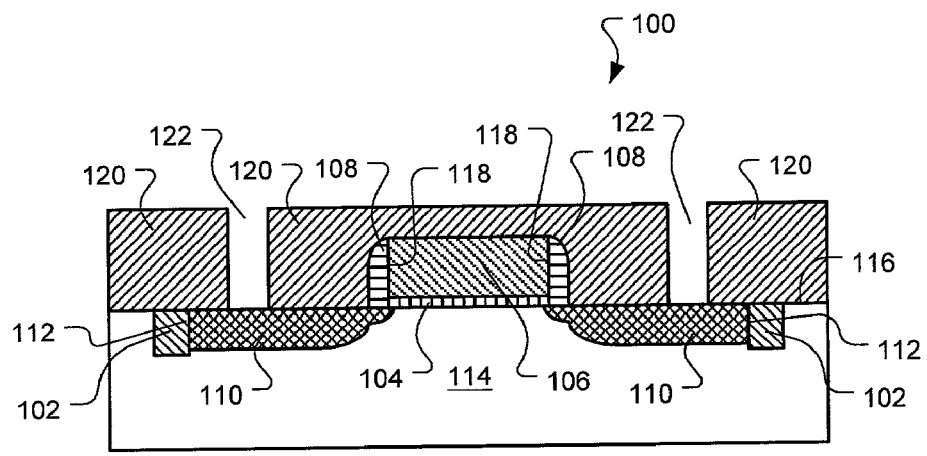
FIG. 1 is a stylized diagram of a portion of conventional a semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

A transistor 100 in an intermediate state during its manufacture is shown in FIG. 1. The transistor 100 is generally comprised of a trench isolation structure 102, a gate insulating layer 104, a gate electrode 106, a sidewall spacer 108, and a plurality of source/drain regions 110. The trench isolation structure 102 may be formed by forming a stop layer made of, for example, silicon nitride on the semiconducting substrate 114, patterning the stop layer, and etching the stop layer and the semiconducting substrate through the opening patterned in the layer of insulating material to form a trench 112. The trench may then be filled with an insulating material (e.g., silicon dioxide, silicon oxynitride, or the like), polishing away excess insulating material using the stop layer (e.g., silicon nitride) as a stop, and wet etching to remove the stop layer.

The gate insulation layer 104 may then be formed on the semiconducting substrate 114 by a variety of known techniques, e.g., a thermal oxidation process or a deposition process, and may be formed from a variety of materials, such as silicon dioxide. Thereafter, the gate electrode 106 may be formed above the gate insulating layer 104 by depositing a layer formed from a variety of materials, such as polysilicon, and then etching the layer to define the gate electrode 106. The sidewall spacers 108 may be then formed by conformally depositing a layer of insulating material (e.g., silicon dioxide, silicon nitride, silicon oxynitride, or the like) over the gate electrode 106 and the upper surface 116 of the semiconducting substrate 114 and then performing an anisotropic etching process to remove all of the conformally-deposited layer except a portion adjacent the sidewalls 118 of the gate electrode 106. The source/drain regions 110 may be formed by one or more ion implantation processes in which a dopant material is implanted into the semiconducting substrate 114. Thereafter, an insulating layer 120, made of, for example, silicon dioxide, silicon nitride, silicon oxynitride, or the like, may be formed over the previously formed structures. One or more openings 122 (e.g., vias or trenches) may be then etched through the insulating layer 120.

Figure 2:
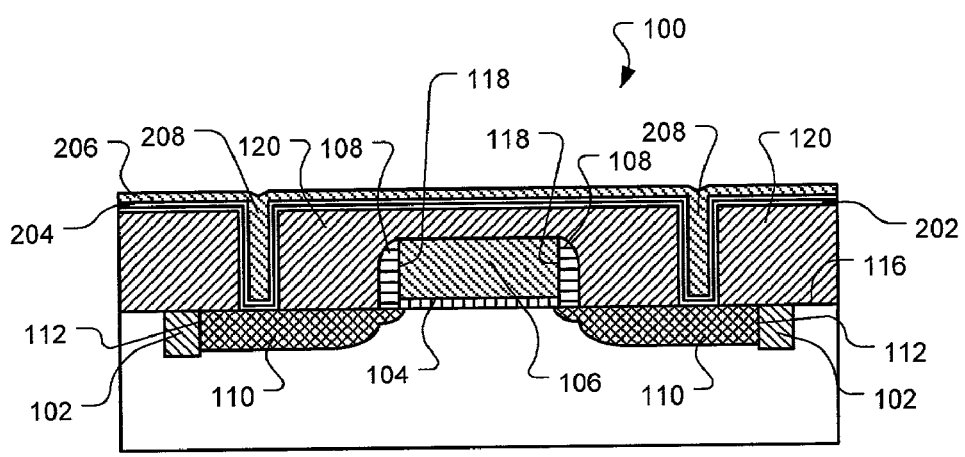
FIG. 2 is a stylized diagram of the portion of the semiconductor device of FIG. 1 having a conductive layer applied thereto.

As illustrated in FIG. 2, a barrier metal layer 202 (e.g., titanium nitride, tantalum, tantalum nitride, or the like) may be deposited over the insulating layer 120 to inhibit migration of copper (deposited in a later process step) into silicon structures. A copper seed layer 204 may then be deposited over the barrier metal. Thereafter, a copper layer 206 may be deposited, typically by a electrolytic plating process, over the copper seed layer 204 to fill the openings 122 (FIG. 1). This process typically produces the copper layer 206 across the entire wafer. Once a sufficiently thick copper layer 206 has been deposited, the copper layer 206 may be planarized using CMP techniques. In the example illustrated in FIGS. 1 and 2, the copper layer 206 is applied to the wafer to provide contacts 208 to source/drain regions 110. After planarizing the copper layer 206, further insulating layers (similar to the insulating layer 120) may be applied to the wafer, etched to form additional openings (e.g., trenches and the like), and filled with copper to form electrical interconnections between the previously formed contacts and the like. Thus, the process of applying an insulating layer, etching the insulating layer to form openings, depositing a copper layer thereover, and planarizing the copper layer is repeated as desired to form multilevel metal schemes, such as dual damascene schemes.

Figure 3:
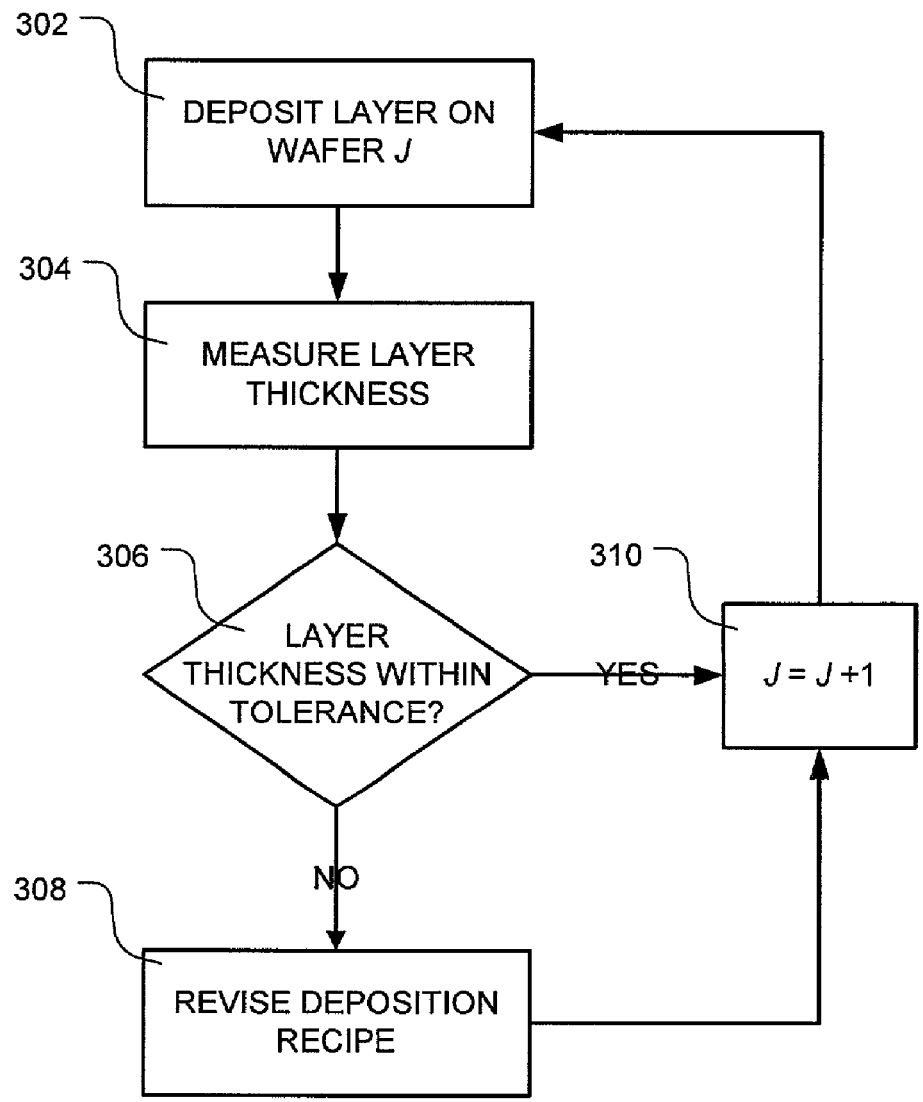
FIG. 3 is a flow chart illustrating a method according to one embodiment of the present invention.

It is generally advantageous to optimize the thickness of a copper layer (e.g., the copper layer 206) so that the copper layer 206 is sufficiently thick to properly conduct electrons as required and is sufficiently thin so that the time and materials required to planarize the copper layer are held to a minimum. Further, it is generally advantageous to optimize the thickness of the copper layer 206 on a wafer-by-wafer basis so that variations in thicknesses of copper layers (e.g., the copper layer 206) on a series of wafers are minimized. Referring now to FIG. 3, the illustrated embodiment comprises depositing a conductive layer (e.g., the copper layer 206) on a wafer J (block 302), wherein J represents a wafer number in a series or lot of wafers. After the conductive layer has been deposited, the thickness of the conductive layer is measured (block 304) and is compared to a predetermined, acceptable thickness tolerance to determine if the thickness of the conductive layer is within acceptable limits (block 306). If the thickness of the conductive layer is not within tolerance, the deposition recipe is revised (block 308) so that the conductive layer on the next wafer (i.e., wafer J+1) will have a thickness that is within tolerance.

The deposition recipe for an electroplating process controls, for example, the electroplating bath temperature, electroplating chemical concentrations, anode-cathode spacing, the anode power settings, the electroplating deposition time, and the like so that the electroplating process will give the desired thickness of the conductive layer. If, however, the thickness of the conductive layer is within tolerance, the next wafer (i.e., wafer J+1) is processed (blocks 310, 302) with no changes to the deposition recipe.

Figure 4:
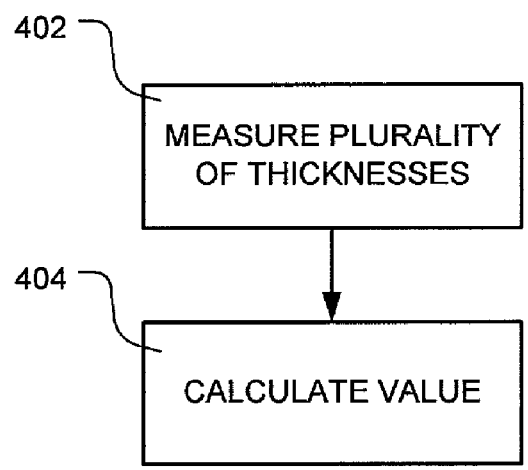
FIG. 4 is a flow chart illustrating a method according to one embodiment of the present invention.
Figure 5:
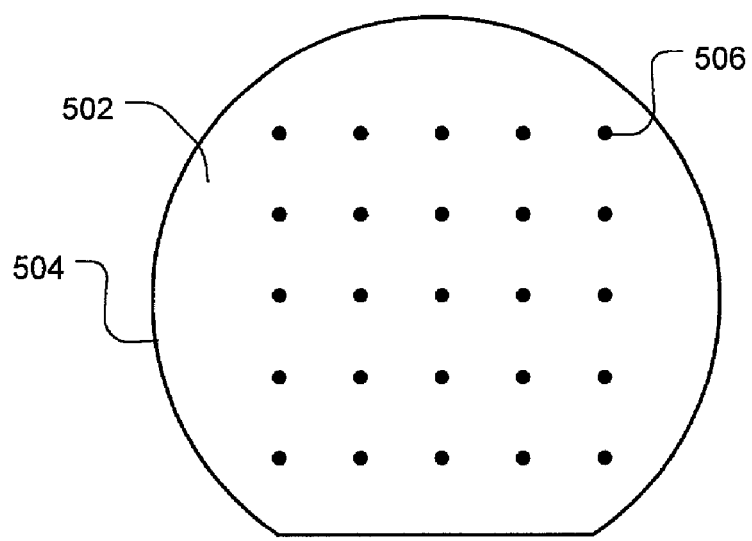
FIG. 5 is a stylized drawing illustrating conductive layer measurement points according to one embodiment of the present invention.

In the embodiment illustrated in FIGS. 4 and 5, the thickness of the conductive layer 502 on a semiconductor wafer 504 is measured (block 304) by measuring a thickness at a plurality of points 506 (only one labeled) on the conductive layer 502 (block 402). A value is calculated that represents the thickness measurements in the aggregate (block 404). The calculated thickness value can be any other representation that adequately reflects the measured thicknesses in the aggregate. In one embodiment, the calculated thickness value is an average of the measured thicknesses, e.g., an arithmetic mean, a median, a mode, a geometric mean, a harmonic mean, a quadratic mean, or the like, of the measured thicknesses. In one embodiment, a measure of dispersion of the data about the calculated thickness value is used to determine whether the layer thickness is within tolerance (block 306) by comparing the measure of dispersion to a predetermined statistical distribution. For example, the measure of dispersion can be a mean deviation, a quartile deviation, a standard deviation, or the like, of the measured thicknesses about the average of the measured thicknesses. The predetermined statistical distribution can be, for example, a normal distribution, a binomial distribution, a Poisson distribution, a multinomial distribution, or the like.

While 25 points 506 at which thickness measurements are taken are illustrated in FIG. 5, any suitable number of points 506 in a predetermined pattern can be utilized. Further, while a rectilinear array of points 506 is illustrated in FIG. 5, any suitable distribution of points 506 can be used.

Figure 6:
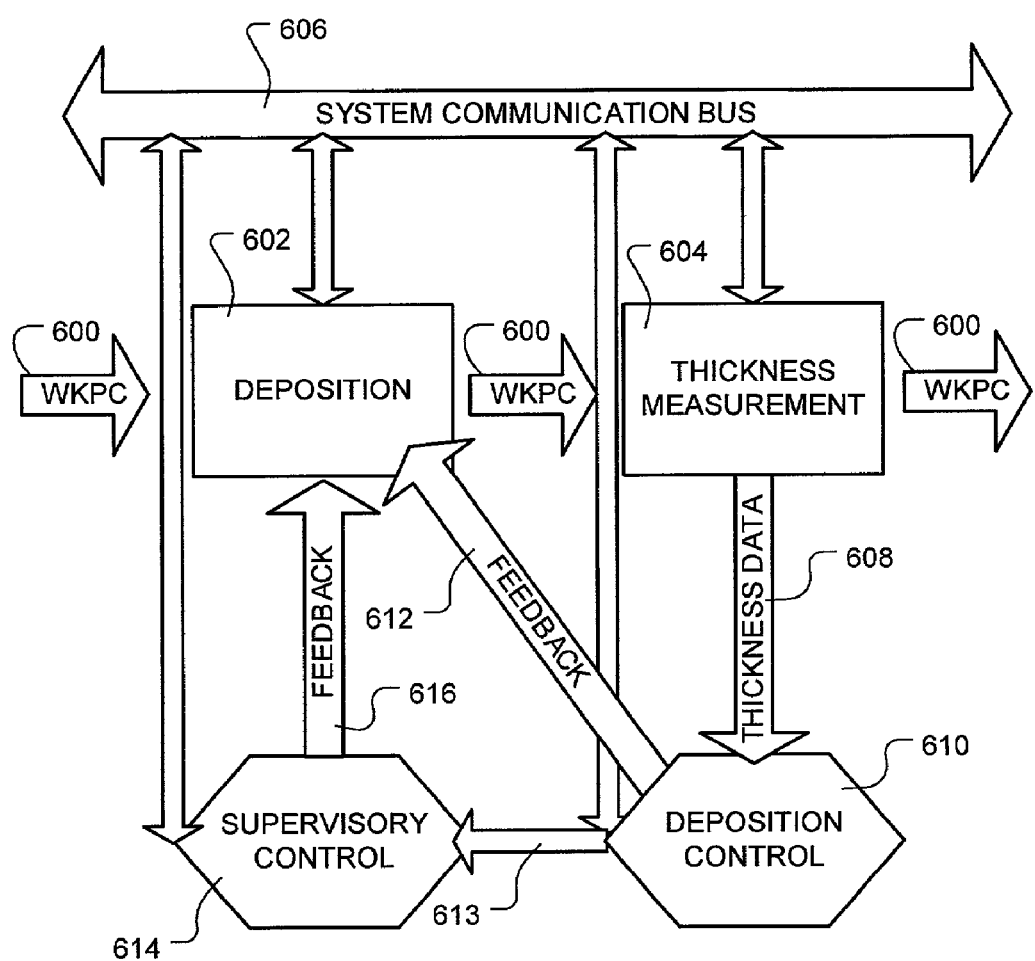
FIG. 6 is a block diagram illustrating the operation of certain embodiments of the present invention.

Referring now to FIG. 6, a workpiece 600 (e.g., a semiconducting substrate or wafer having one or more process layers and/or semiconductor devices disposed thereon) is delivered to a deposition unit 602 that deposits a conductive layer (not shown) on the workpiece 600. The workpiece 600 is then delivered to a thickness measurement unit 604 that measures the thickness of the conductive layer deposited on the workpiece by the deposition unit 602. Thickness data 608 resulting from the thickness measurement unit 604 can be a single thickness measurement or can be a calculated value corresponding to a plurality of thickness measurements, as illustrated in FIGS. 4 and 5. Using a system communication bus 606, data and/or instructions may be exchanged between any or all of the various units illustrated in FIG. 6 or that are otherwise part of the system comprising the units illustrated in FIG. 6. Thickness data 608 is sent from the thickness measurement unit 604 to the deposition control unit 610, wherein the thickness data 608 is evaluated to determine if the thickness of the conductive layer on the workpiece 600 is within tolerance. If the thickness is not within tolerance, appropriate changes are made to the deposition recipe by the deposition control unit 610 and the revised deposition recipe is provided as feedback 612 to the deposition unit 602. In the illustrated embodiment, the deposition control unit 610 also provides information corresponding to the feedback 612 (represented by arrow 613) to a supervisory control 614 that may act as an overall manufacturing system supervisory control loop, which may then provide the revised deposition recipe as feedback 616. Rather than providing a revised process recipe, it is within the scope of the present invention for the deposition control unit 610 to calculate bias information and to provide bias information to the supervisory control unit 614 (represented by the arrow 513) and as feedback 612 to the deposition unit 602, and further for the supervisory control unit 614 to provide the bias information as feedback 616 to the deposition unit 602. In this embodiment, the bias information corresponds to the changes to be made in the deposition unit 602 to correct for unacceptable variation in conductive layer thickness.

Figure 7:
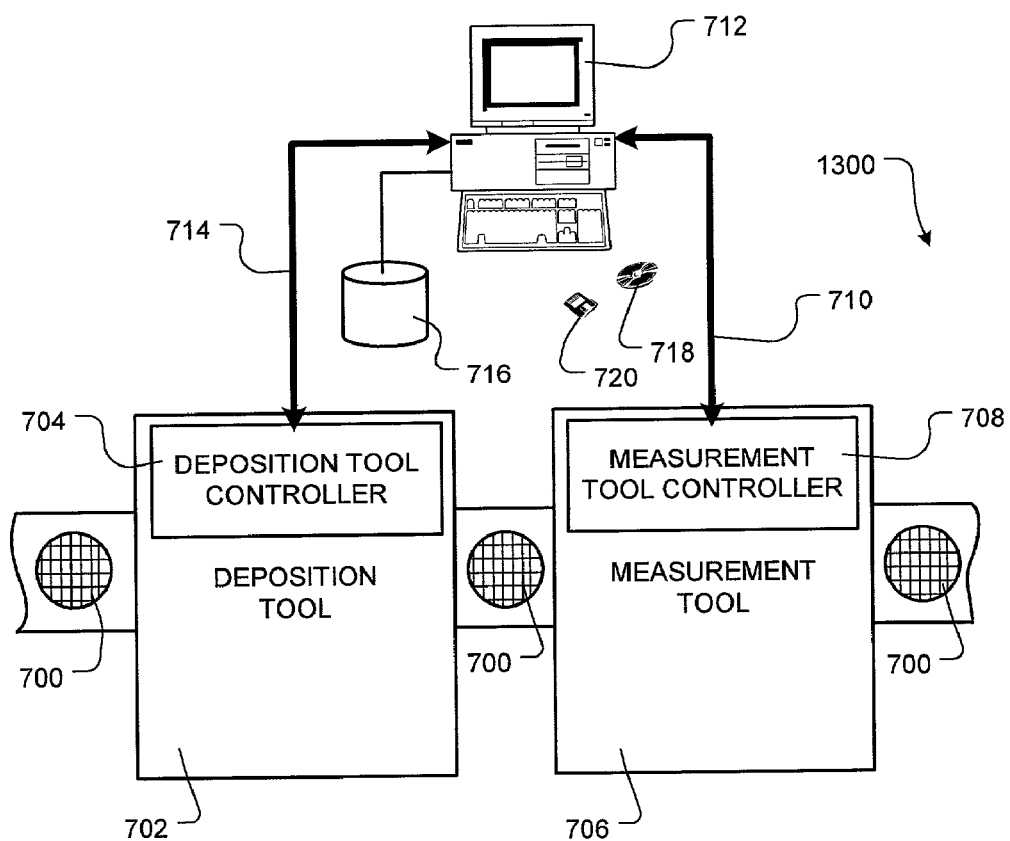
FIG. 7 is a stylized diagram of an embodiment of an illustrative system according to the present invention.

As illustrated in FIG. 7, a workpiece 700 (e.g., a semiconducting substrate or wafer having one or more process layers and/or semiconductor devices disposed thereon) is delivered to a deposition tool 702 having a deposition tool controller 704. The deposition tool 702 deposits a conductive layer (not shown) onto the workpiece 700. The workpiece 700 is then delivered to a thickness measurement tool 706 having a measurement tool controller 708. The measurement tool 706 measures the thickness of the conductive layer deposited on the workpiece by the deposition tool 702. Thickness data, which can be a single thickness measurement or can be a calculated value corresponding to a plurality of thickness measurements, as illustrated in FIGS. 4 and 5, is sent via a line 710 from the measurement tool controller 708 to a computer 712, wherein the thickness data is evaluated to determine if the thickness of the conductive layer on the workpiece 700 is within tolerance. If the thickness is not within tolerance, appropriate changes are made to the deposition recipe by the computer 712 and the revised deposition recipe is provided to the deposition tool controller 704 via line 714.

Rather than the computer 712 providing a revised process recipe to the deposition tool controller 704, it is within the scope of the present invention for the computer 712 to provide bias information to the deposition tool controller. In this embodiment, the bias information corresponds to the changes to be made in the deposition process to be performed on the next workpiece (not shown) by the deposition tool 702.

In one embodiment of the present invention, a database 716 stores a plurality of models that might potentially be applied, depending upon the current state of parameters being in use by the deposition tool 702 and the thickness information from the measurement tool 706 and/or the measurement tool controller 708. The computer system 712 then extracts an appropriate model from the database 716 of potential models to apply the identified characteristic parameters. If the database 716 does not comprise an appropriate model, then the characteristic parameter may be ignored or the computer system 712 may attempt to develop one, if so programmed. The database 716 may be stored on any kind of computer-readable program storage medium, for example an optical disk 718, a floppy disk 720, or a hard disk drive (not shown) of the computer system 712. The database 712 may also be stored on a separate computer system (not shown) that interfaces with the computer system 712.

Modeling of the identified characteristic parameters may be implemented differently in alternative embodiments. For instance, the computer system 712 may be programmed using some form of artificial intelligence to analyze deposition process results (e.g., layer thickness, layer uniformity, etc.) and controller inputs to develop a model on-the-fly in a real-time implementation. In certain situations, this approach can be a useful adjunct to the embodiment illustrated in FIG. 7 and discussed above, wherein characteristic parameters are measured and identified for which the database 716 has no appropriate model.

As is evident from the discussion above, some features of the present invention may be implemented in software. For instance, the acts set forth in the blocks 302–310 in FIG. 3 and blocks 402 and 404 in FIG. 4 are, in certain embodiments, software-implemented, in whole or in part. Thus, some features of the present invention are implemented as instructions encoded on a computer-readable program storage medium. The program storage medium may be of any type suitable to the particular implementation. However, the program storage medium will typically be magnetic, such as the floppy disk 720 or the computer 712 hard disk drive (not shown), or optical, such as the optical disk 718. When these instructions are executed by a computer, they perform the disclosed functions. The computer may be a desktop computer, such as the computer 712. However, the computer might alternatively be a processor embedded in the deposition tool 702 or in the measurement tool 706. The computer might also be a laptop, a workstation, or a mainframe in various other embodiments. The scope of the invention is not limited by the type or nature of the program storage medium or computer with which embodiments of the invention might be implemented.

Thus, some portions of the detailed descriptions herein are, or may be, presented in terms of algorithms, functions, techniques, and/or processes. These terms enable those skilled in the art most effectively to convey the substance of their work to others skilled in the art. These terms are here, and are generally, conceived to be a self-consistent sequence of steps leading to a desired result. The steps are those requiring physical manipulations of physical quantities. Usually, though not necessarily, these quantities take the form of electromagnetic signals capable of being stored, transferred, combined, compared, and otherwise manipulated.

It has proven convenient at times, principally for reasons of common usage, to refer to these signals as bits, values, elements, symbols, characters, terms, numbers, and the like. All of these and similar terms are to be associated with the appropriate physical quantities and are merely convenient labels applied to these quantities and actions. Unless specifically stated otherwise, or as may be apparent from the discussion, terms such as "processing," "computing," "calculating," "determining," "displaying," and the like, used herein refer to the action(s) and processes of a computer system, or similar electronic and/or mechanical computing device, that manipulates and transforms data, represented as physical (electromagnetic) quantities within the computer system's registers and/or memories, into other data similarly represented as physical quantities within the computer system's memories and/or registers and/or other such information storage, transmission and/or display devices.

Any of the above-disclosed embodiments of a method according to the present invention enables the use of parametric measurements sent from measuring tools to make supervisory processing adjustments, either manually and/or automatically, to improve and/or better control the yield. Additionally, any of the above-disclosed embodiments of a method of manufacturing according to the present invention enables semiconductor device fabrication with increased device accuracy and precision, increased efficiency and increased device yield, enabling a streamlined and simplified process flow, thereby decreasing the complexity and lowering the costs of the manufacturing process and increasing throughput.

The present invention encompasses the various embodiments disclosed herein and their equivalents as applied to controlling a thickness of one or more copper conductive layers in a semiconductor manufacturing operation. The present invention, however, is not so limited but rather encompasses a method and apparatus for controlling a thickness of one or more conductive layers, made from any material, in a semiconductor manufacturing operation.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of controlling a conductive layer deposition process, comprising:
   depositing a conductive layer above a first semiconductor wafer based upon a deposition recipe;
   measuring a thickness of the conductive layer deposited on the semiconductor wafer;
   determining whether the measured thickness of the conductive layer is within a predetermined tolerance; and
   revising at least one parameter selected from the group consisting of a chemical concentration of an electroplating bath and an anode-cathode spacing of the deposition recipe if the measured thickness of the conductive layer is not within the predetermined tolerance.

2. A method, according to claim 1, wherein:
   depositing the conductive layer above the first semiconductor wafer further comprises depositing a copper layer above the first semiconductor wafer;
   measuring the thickness of the conductive layer further comprises measuring the thickness of the copper layer;
   determining whether the measured thickness of the conductive layer is within the predetermined tolerance further comprises determining whether the measured thickness of the copper layer is within the predetermined tolerance; and
   revising the deposition recipe further comprises revising the deposition recipe if the measured thickness of the copper layer is not within the predetermined tolerance.

3. A method, according to claim 1, further comprising depositing a conductive layer above a second semiconductor wafer based upon the revised deposition recipe.

4. A method, according to claim 1, wherein revising the deposition recipe further comprises revising the deposition recipe according to at least one predetermined model.

5. A method of controlling a conductive layer deposition process, comprising:
   depositing a conductive layer above a first semiconductor wafer based upon a deposition recipe;
   measuring a thickness of the conductive layer at a plurality of locations;
   calculating a value representing the measured thickness measured at the plurality of locations;
   determining whether the calculated value is within a predetermined tolerance; and
   revising at least one parameter selected from the group consisting of a chemical concentration of an electroplating bath and an anode-cathode spacing of the deposition recipe based upon at least the calculated value if the calculated value is not within the predetermined tolerance.

6. A method, according to claim 5, wherein:
   depositing the conductive layer above the first semiconductor wafer further comprises depositing a copper layer above the first semiconductor wafer; and
   measuring the thickness of the conductive layer further comprises measuring the thickness of the copper layer at the plurality of locations.

7. A method, according to claim 5, wherein measuring the thickness of the conductive layer further comprises measuring the thickness of the conductive layer in a predetermined pattern of locations.

8. A method, according to claim 5, wherein calculating the value further comprises calculating an average of the plurality of thickness measurements.

9. A method, according to claim 5, wherein calculating the value further comprises calculating the value selected from the group consisting of an arithmetic mean of the plurality of thickness measurements, a median of the plurality of thickness measurements, a mode of the plurality of thickness measurements, a geometric mean of the plurality of thickness measurements, a harmonic mean of the plurality of thickness measurements, and a quadratic mean of the plurality of thickness measurements.

10. A method according to claim 5, wherein determining whether the thickness of the conductive layer is within the predetermined tolerance further comprises calculating a measure of a degree of dispersion of the plurality of thickness measurements about the calculated value and comparing the measure of the degree of dispersion to a predetermined statistical distribution.

11. A method, according to claim 5, wherein determining whether the thickness of the conductive layer is within the predetermined tolerance further comprises calculating a measure of a degree of dispersion of the plurality of thickness measurements about the calculated value representing the measured thicknesses and comparing the measure of the degree of dispersion to a distribution selected from the group consisting of a normal distribution, a binomial distribution, a Poisson distribution, and a multinomial distribution.

12. A method, according to claim 5, wherein revising the deposition recipe further comprises revising the deposition recipe according to at least one predetermined model.

13. A method, according to claim 5, further comprising depositing a conductive layer above a second semiconductor wafer based upon the revised deposition recipe.

\* \* \* \* \*